United States Patent
Farnworth et al.

(10) Patent No.: US 7,189,954 B2
(45) Date of Patent: Mar. 13, 2007

(54) MICROELECTRONIC IMAGERS WITH OPTICAL DEVICES AND METHODS OF MANUFACTURING SUCH MICROELECTRONIC IMAGERS

(75) Inventors: Warren M. Farnworth, Nampa, ID (US); Sidney B. Rigg, Meridian, ID (US); William Mark Hiatt, Eagle, ID (US); Alan G. Wood, Boise, ID (US); Peter A. Benson, Boise, ID (US); James M. Wark, Boise, ID (US); David R. Hembree, Boise, ID (US); Kyle K. Kirby, Boise, ID (US); Charles M. Watkins, Eagle, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 10/894,262

(22) Filed: Jul. 19, 2004

(65) Prior Publication Data

US 2006/0011809 A1    Jan. 19, 2006

(51) Int. Cl.
 H01L 31/0232   (2006.01)
 H01L 27/00    (2006.01)
(52) U.S. Cl. ............... 250/208.1; 250/214.1; 257/432; 257/434
(58) Field of Classification Search ............. 250/208.1, 250/214.1, 239; 257/432–434
 See application file for complete search history.

(56) References Cited

U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |

(Continued)

FOREIGN PATENT DOCUMENTS

EP    0 886 323    12/1998

(Continued)

OTHER PUBLICATIONS

Aachboun, S. and P. Ranson, "Cryogenic etching of deep narrow trenches in silicon," J. Vac. Sci. Technol. A 18(4), Jul./Aug. 2000, pp. 1848-1852.

(Continued)

*Primary Examiner*—Kevin Pyo
(74) *Attorney, Agent, or Firm*—Dickstein Shapiro LLP

(57) ABSTRACT

Microelectronic imager assemblies comprising a workpiece including a substrate and a plurality of imaging dies on and/or in the substrate. The substrate includes a front side and a back side, and the imaging dies comprise imaging sensors at the front side of the substrate and external contacts operatively coupled to the image sensors. The microelectronic imager assembly further comprises optics supports superimposed relative to the imaging dies. The optics supports can be directly on the substrate or on a cover over the substrate. Individual optics supports can have (a) an opening aligned with one of the image sensors, and (b) a bearing element at a reference distance from the image sensor. The microelectronic imager assembly can further include optical devices mounted or otherwise carried by the optics supports.

15 Claims, 14 Drawing Sheets

U.S. PATENT DOCUMENTS

| | | | |
|---|---|---|---|
| 5,435,887 A | 7/1995 | Rothschild et al. | |
| 5,505,804 A | 4/1996 | Mizuguchi et al. | |
| 5,593,913 A | 1/1997 | Aoki | |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,483,652 B2 | 11/2002 | Nakamura | |
| 6,503,780 B1 | 1/2003 | Glenn et al. | |
| 6,541,762 B2 | 4/2003 | Knag et al. | |
| 6,560,047 B2 | 5/2003 | Choi et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,864,172 B2 | 4/2004 | Noma et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 7,059,040 B1 * | 6/2006 | Webster et al. | 29/831 |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0184219 A1 * | 8/2005 | Kirby | 250/208.1 |
| 2005/0236708 A1 | 10/2005 | Farnworth et al. | |
| 2005/0254133 A1 | 11/2005 | Akram et al. | |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%20Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behinger; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS Imager," 3 pages, EE Times, Jul. 18, 2003.

* cited by examiner

MICROELECTRONIC IMAGERS WITH OPTICAL DEVICES AND METHODS OF MANUFACTURING SUCH MICROELECTRONIC IMAGERS

TECHNICAL FIELD

The present invention is related to microelectronic imagers and methods for packaging microelectronic imagers. Several aspects of the present invention, more specifically, are directed toward installing optical devices in microelectronic imagers.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10, and a housing 30 attached to the interposer 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer 20 by wire-bonds 28 to provide electrical pathways between the bond-pads 14 and the ball-pads 24. The interposer 20 can alternatively be a lead frame or ceramic fixture.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the internal threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 μm of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator manually rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming, subject to operator errors, and subject to axial misalignment between the support 50 and the barrel 60.

Yet another concern of conventional microelectronic imagers is that they have relatively large footprints and occupy a significant amount of vertical space (i.e., high profiles). The footprint of the imager in FIG. 1 is the surface area of the bottom of the interposer 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. The conventional imager 1 shown in FIG. 1 is also expensive because each cover 40 is individually attached to the housing 30, and each housing 30 is individually attached to an interposer 20. Moreover, the support 50 and barrel 60 are assembled separately for each die 10 individually after the dies have been singulated from a wafer and attached to the interposer 20. Therefore, there is a significant need to enhance the efficiency, reliability and precision of packaging microelectronic imagers.

DETAILED DESCRIPTION

A. Overview

Figure 1:
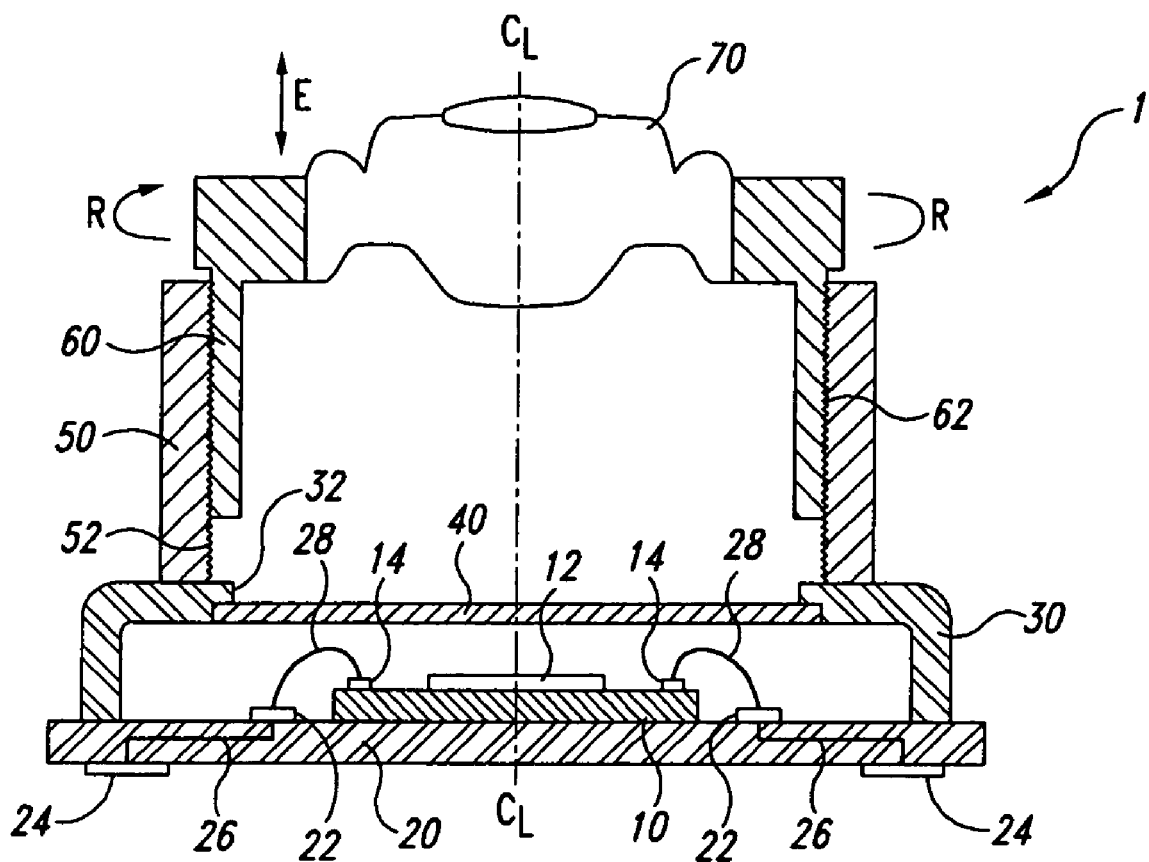
FIG. 1 is a schematic side cross-sectional view of a packaged microelectronic imager in accordance with the prior art.

The following disclosure describes several embodiments of methods for assembling optical devices with microelectronic imaging units and microelectronic imagers that are formed using such methods. One aspect of the invention is directed toward methods of manufacturing microelectronic imagers. An embodiment of one such method comprises providing an imager workpiece and constructing optics supports on the imager workpiece. The imager workpiece has a plurality of imaging dies that include image sensors and external contacts operatively coupled to the image sensors. The imaging dies can be on and/or in a first substrate such that the image sensors are at a front side of the first substrate. The optics supports are constructed on the imager workpiece before cutting the imager workpiece. The optics supports, for example, can be constructed on the first substrate or on a cover attached to the first substrate. The optics supports include openings aligned with corresponding image sensors and bearing elements at reference locations relative to corresponding image sensors. The method can further include attaching optical devices to the bearing elements. The optical devices, for example, can include focus lenses, dispersion lenses, pin-hole lenses, filters and/or anti-reflective coatings. In several embodiments, the optical devices are generally attached to the bearing elements before cutting the first substrate.

Another aspect of the invention is directed toward a microelectronic imager assembly. One embodiment of such a microelectronic imager assembly comprises a workpiece including a substrate and a plurality of imaging dies on and/or in the substrate. The substrate includes a front side and a back side, and the imaging dies comprise imaging sensors at the front side of the substrate and external contacts operatively coupled to the image sensors. The microelectronic imager assembly further comprises optics supports superimposed relative to the imaging dies. The optics supports can be directly on the substrate or on a cover over the substrate. Individual optics supports can have (a) an opening aligned with one of the image sensors, and (b) a bearing element at a reference distance from the image sensor. The microelectronic imager assembly can further include optical devices mounted or otherwise carried by the optics supports. The optical devices can include optics elements that are aligned with corresponding image sensors on the imaging dies.

Several details of specific embodiments of the invention are described below with reference to CMOS imagers to provide a thorough understanding of these embodiments. CCD imagers or other types of sensors, however, can be used instead of the CMOS imagers in other embodiments of the invention. Several details describing well-known structures often associated with microelectronic devices may not be set forth in the following description for the purposes of brevity. Moreover, other embodiments of the invention can have different configurations or different components than those described in this section. As such, other embodiments of the invention may have additional elements or may not include all of the elements shown and described below with reference to FIGS. 2–7C.

B. Microelectronic Imagers Packaged at the Wafer-Level

Figure 2:
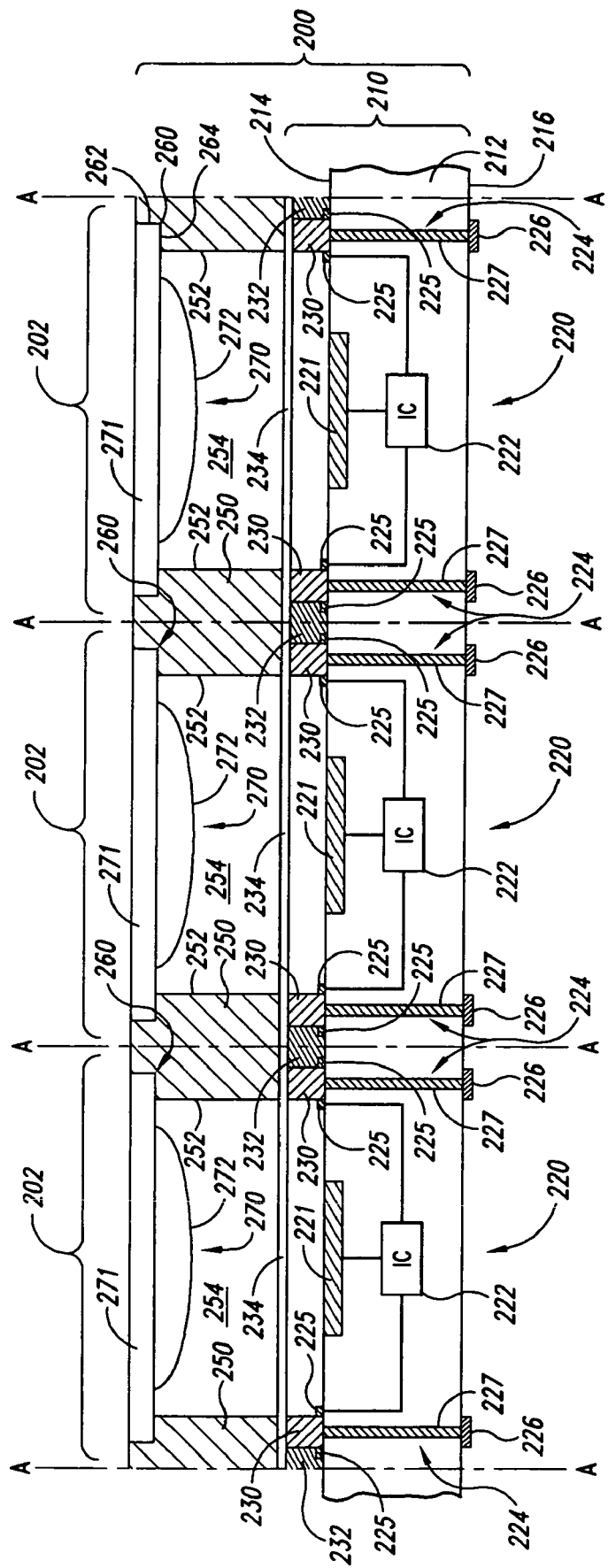
FIG. 2 is a cross-sectional view illustrating a plurality of imagers packaged at the wafer level in accordance with an embodiment of the invention.

FIG. 2 is a side cross sectional view illustrating an assembly 200 having a plurality of microelectronic imagers 202 that have been packaged at the wafer-level in accordance with several embodiments of the invention. The embodiment of the assembly 200 shown in FIG. 2 includes an imager workpiece 210, optics supports 250 on the imager workpiece 210, and optical devices 270 attached to the optics supports 250. The assembly 200 is typically manufactured by providing the imager workpiece 210, constructing the optics supports 250 on the imager workpiece 210, and then attaching the optical devices 270 to the optics supports 250. The optics supports 250 and the optical devices 270 can be assembled using automated handling equipment before cutting the imager workpiece 210 in accordance with several embodiments of the invention.

The imager workpiece 210 includes a first substrate 212 having a front side 214 and a back side 216. The imager workpiece 210 further includes a plurality of imaging dies 220 formed on and/or in the first substrate 212. Individual imaging dies 220 can include an image sensor 221, integrated circuitry (IC) 222 operatively coupled to the image sensor 221, and external contacts 224 electrically coupled to the integrated circuitry 222. The image sensors 221 can be CMOS devices or CCD image sensors for capturing pictures or other images in the visible spectrum, but the image sensors 221 can detect radiation in other spectrums (e.g., IR or UV ranges). The embodiment of the external contacts 224 shown in FIG. 2 provides a small array of ball-pads within the footprint of the individual imaging dies 220. Each external contact 224, for example, can include a terminal 225 (e.g., bond-pad), a contact pad 226 (e.g., ball-pad), and a through-wafer interconnect 227 coupling the terminal 225 to the contact pad 226. Although the terminal 225 is shown at the front side 214, it can also be at an intermediate depth within the first substrate 212. The through-wafer interconnects 227 can be formed according to the processes disclosed in U.S. patent application Ser. No. 10/713,878, entitled Microelectronic Devices, Methods for Forming Vias in Microelectronic Devices, and Methods for Packaging Microelectronic Devices, filed on Nov. 13, 2003, which is incorporated by reference herein in its entirety. Other embodiments of external contacts can include contacts having traces that wrap around the side of the first substrate 212.

The imaging dies 220 can further include spacers 230 projecting from the front side 214 of the first substrate 212. The spacers 230 can be conductive elements that project upwardly from the interconnects 227. The spacers 230 can alternatively be dielectric elements deposited onto the first substrate 212 or manufactured separately from the first substrate and adhered to the front side 214.

The imaging workpiece 210 further includes a sealant 232 around an outer perimeter portion of the spacers 230 and a cover 234 attached to the spacers. The cover 234 can be glass, quartz, or another suitable material that is transmissive to the desired spectrum of radiation. The cover 234, for example, can further include one or more anti-reflective films and/or filters. Additionally, the cover 234 can be a single pane covering a plurality of the dies 220 as shown in FIG. 2, or the cover 234 can have individual panes over each die 220.

The assembly 200 further includes a plurality of the optics supports 250 on the imager workpiece 210 and a plurality of the optical devices 270. The optics supports 250 include bearing elements 260 that interface with the optical devices 270. The bearing elements 260, for example, can include an alignment surface 262 and a reference surface 264. The optical devices 270 can include a second substrate 271 and an optics element 272 carried by the second substrate 271. The second substrate 271 is typically a window that is transmissive to the selected radiation, and the optics elements 272 can include focus lenses, dispersion lenses, pin-hole lenses, filters and/or anti-reflective films. The bearing elements 260 interface with the second substrates 271 to (a) align the optics elements 272 with corresponding image sensors 221, and (b) space the optics elements 272 apart from corresponding image sensors 221 by a desired distance. More specifically, the alignment surface 262 aligns the optics elements 272 and the reference surface 264 spaces the optics elements 272 apart from the image sensors 221 by the desired focal distance.

The embodiment of the assembly 200 shown in FIG. 2 is fabricated at the wafer level such that several imagers 202 are packaged before singulating (e.g., cutting) the first substrate 212 to separate the individual image sensors 202 from each other. One aspect of wafer-level packaging is using automated handling equipment to install the optical devices 270 such that the optics elements 272 are aligned with and spaced apart from the corresponding image sensors. This is achieved, in part, by constructing the support members 250 using fast, accurate processes. FIGS. 3A–7C illustrate several embodiments of methods for (a) constructing the optics supports 250 and (b) mounting the optical devices 270 to the optics supports 250 for wafer-level packaging of microelectronic imagers.

C. Optics Supports and Optical Devices

Figure 3A:
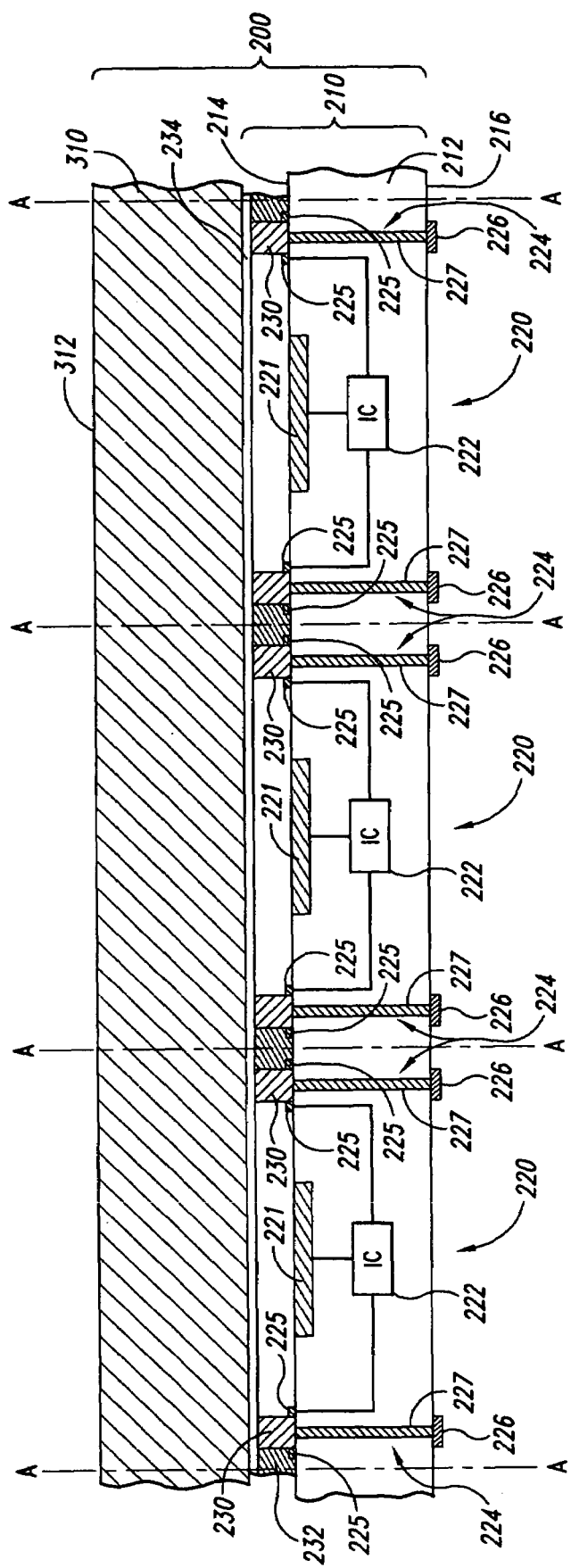
FIGS. 3A–3E are schematic side cross-sectional views illustrating stages of a method of installing optical devices in accordance with an embodiment of the invention.

FIGS. 3A–3E illustrate stages in one embodiment of a method for forming optics supports that accurately position optical devices with respect to corresponding image sensors. Referring to FIG. 3A, this embodiment of the method includes depositing a support material layer 310 onto the cover 234. The support material layer 310 can be deposited onto the cover 234 using vapor deposition processes (e.g., chemical vapor deposition or physical vapor deposition), three-dimensional stereolithography processes, spin-on techniques, spraying techniques, molding or other processes. The support material layer 310 can alternatively be formed separately from the workpiece 210 and then attached to the cover 234. The support material layer 310 has an upper surface 312 at a desired distance from the cover 234 to define a reference plane relative to the image sensors 221. The upper surface 312 can be formed at a precise distance from the cover 234 by planarizing the support material layer 310 using chemical-mechanical planarization. In several embodiments, however, the upper surface 312 can be formed at the desired distance from the cover 234 in the deposition process without planarizing the support material layer 310. The support material layer 310 can be composed of polymeric materials, ceramics, metals and/or other suitable materials.

Figure 3B:
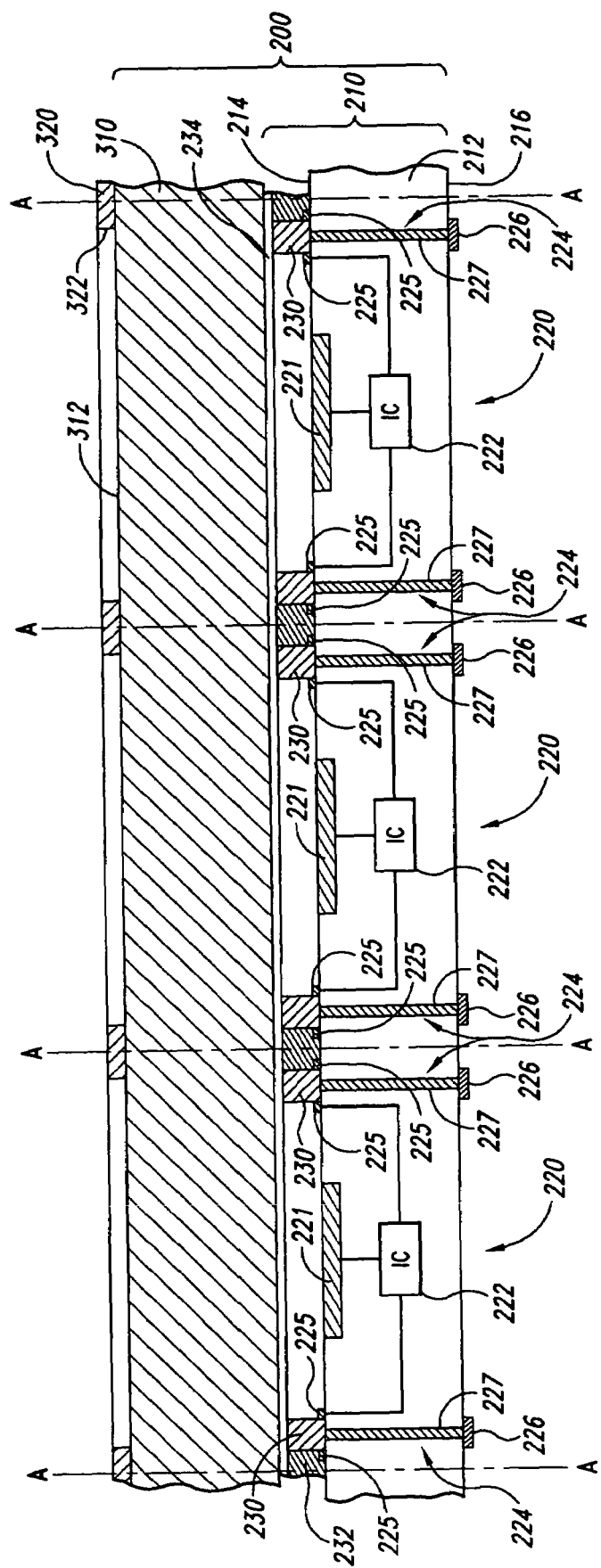
Figure 3C:
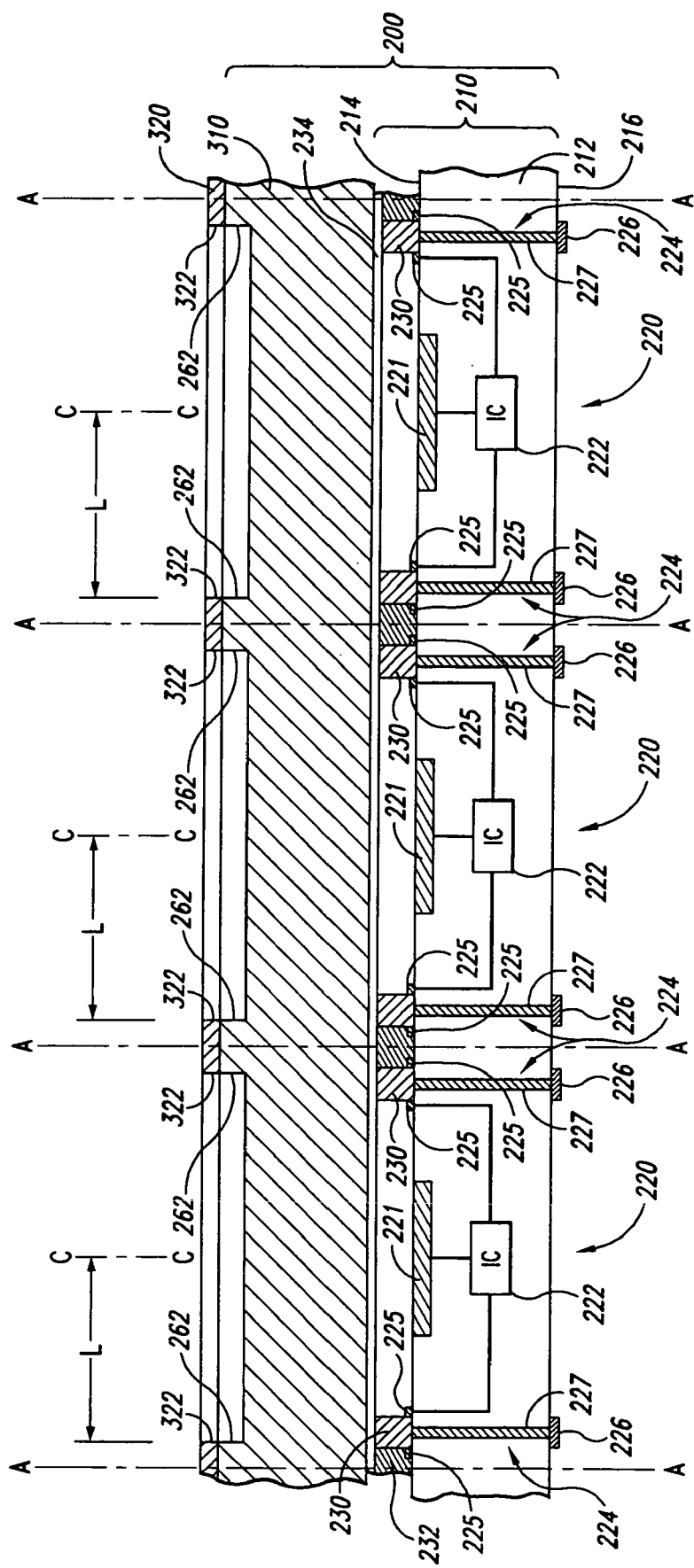

The bearing elements 260 (FIG. 2) are then etched into the upper portion of the support material layer 310. Referring to FIG. 3B, for example, a resist layer 320 is deposited onto the support material layer 310 and patterned to have openings 322. As shown in FIG. 3C, an upper portion of the support material layer 310 is then etched to a desired depth to form the alignment surfaces 262 at a desired location relative to the corresponding image sensors 221. The support material layer 310 can be etched to an intermediate depth using a first etch, such as an anisotropic etch. The alignment surfaces 262 are laterally spaced apart from alignment axes C—C of corresponding image sensors 221 by a precise distance to engage the edges of the second substrates 271 (FIG. 2) and align the optics elements 272 (FIG. 2) with corresponding imager sensors 221.

Figure 3D:
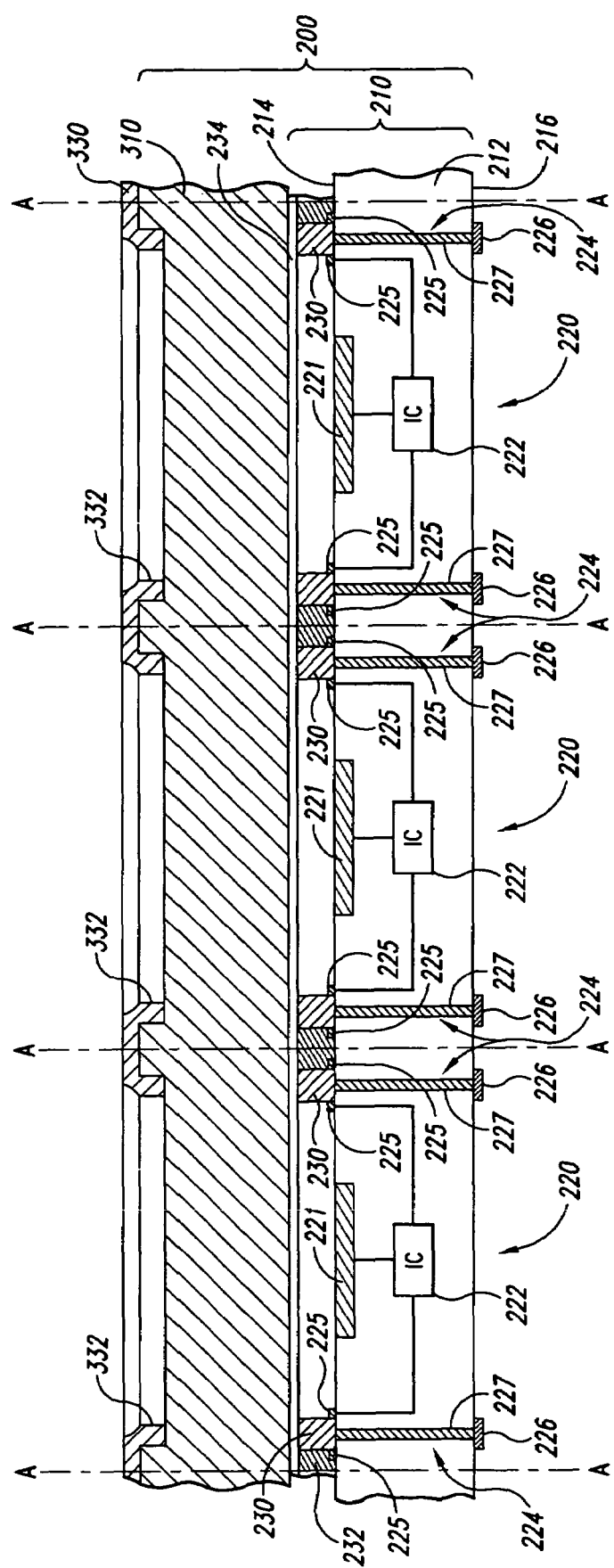
Figure 3E:
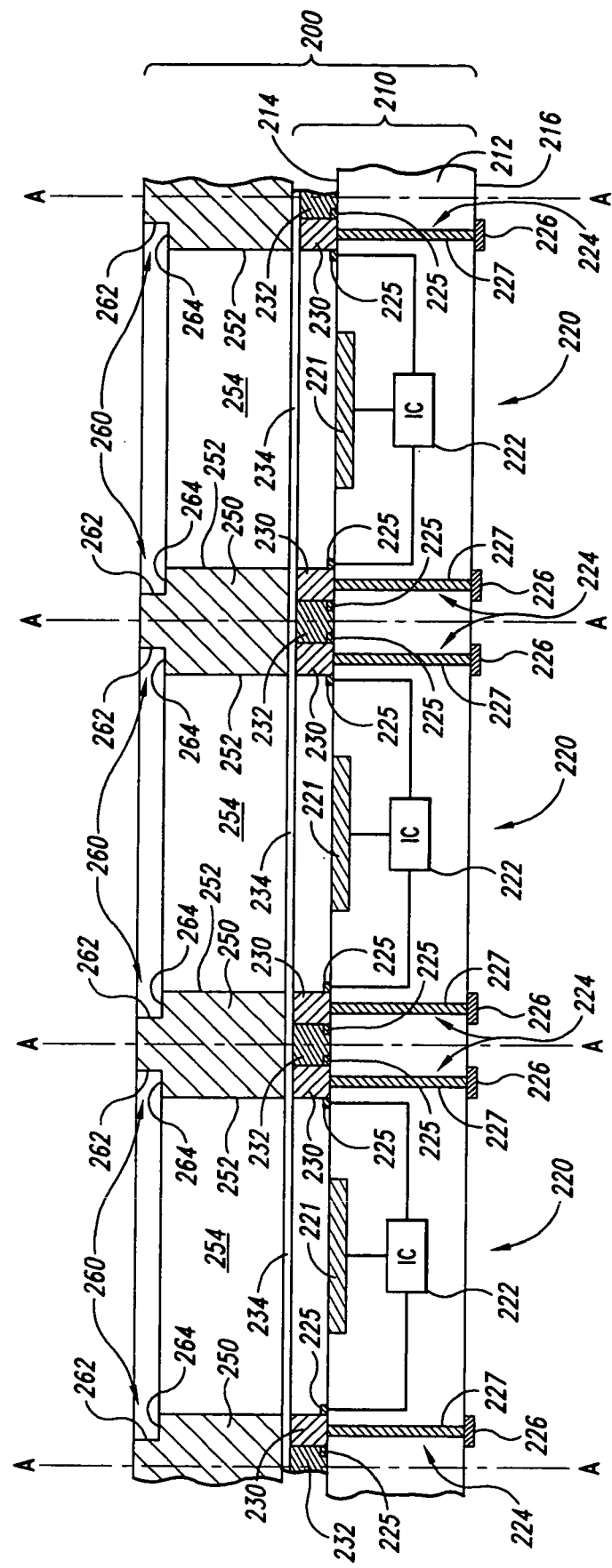

The reference surfaces 264 of the bearing elements 260 and the openings 254 of the optics supports are then formed from the remaining portion of the support material layer 310. Referring to FIG. 3D, a second resist layer 330 is deposited onto the support material layer 310 and patterned to have openings 332. The exposed portions of the support material layer 310 are then etched through the openings 332. Referring to FIG. 3E, this second etch forms the sidewalls 252 so that they are superimposed relative to a perimeter zone around corresponding image sensors 221. The sidewalls 252 shape the openings 254 so that they are aligned with corresponding image sensors 221. The second etch shown in FIG. 3E also forms the reference surfaces 264 of the bearing elements 260 at a desired reference distance relative to the image sensors 221. The second etch can be an anisotropic etch that is stopped at or slightly before the cover 234.

After the optics supports 250 have been formed as shown in FIG. 3E, the optical devices 270 are mounted to the optics supports 250 as shown in FIG. 2. The optical devices 270 of the embodiment shown in FIG. 2 have been singulated to separate the individual optical devices 270 from each other before being mounted to the optics supports 250. Automatic handling equipment can place the individual optical devices 270 on corresponding-optics supports 250. More specifically, individual bearing elements 260 can receive the perimeter portion of one of the second substrates 271 such that the optics element 272 of each optical device 270 is at a desired position with respect to a corresponding image sensor 221.

The optics supports 250 fabricated as shown in FIGS. 3A–3E have precise dimensions to accurately position the optical devices 270 with respect to corresponding image sensors 221. For example, the upper surface 312 of the support material layer 310 can be formed at a precise distance from the imager sensors 221 across the entire imager workpiece 210 because chemical-mechanical planarization and certain deposition processes are capable of forming highly planar surfaces at exact endpoints across a wafer. Additionally, the first and second etches shown in FIGS. 3B–3E can accurately form the alignment surfaces 262 and the reference surfaces 264 with respect to corresponding image sensors 221 with a high degree of precision. Therefore, the bearing elements 260 have precise dimensions that are located relative to the image sensors to position the optical devices 270 (FIG. 2) within very tight tolerances. This allows automated handling equipment to attach the optical devices to the imagining units at the wafer level without manually adjusting the focal distance.

The embodiment of the method illustrated in FIGS. 3A–3E is also efficient in that it has a relatively high throughput and uses existing equipment and processes in a semiconductor fabrication facility. The deposition, chemical-mechanical planarization and etching procedures are established processes that are used to manufacture semiconductor devices having feature sizes of 0.11 µm or less. As a result, the optics supports 250 can be formed in a process flow for manufacturing semiconductor devices.

Figure 4A:
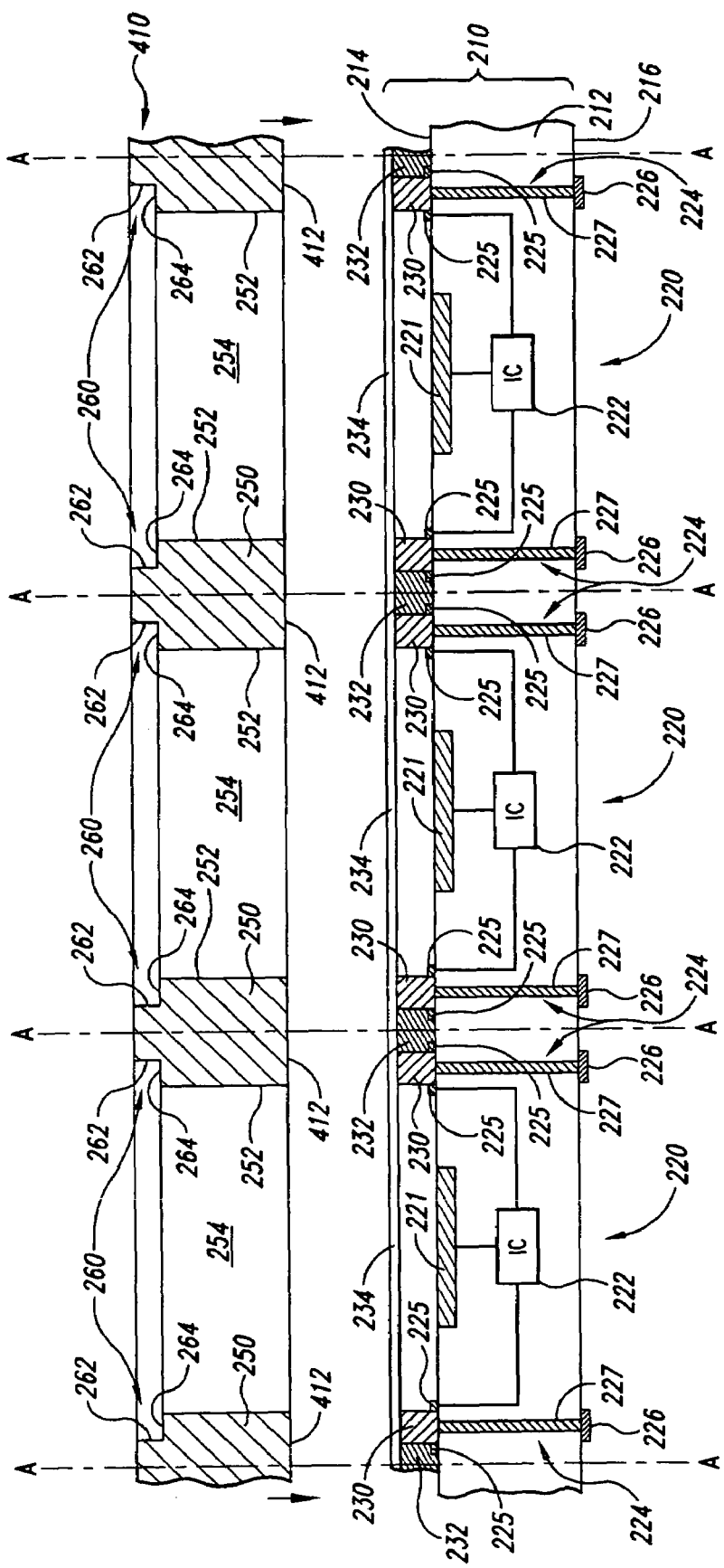
FIGS. 4A and 4B are schematic side cross-sectional views illustrating stages of a method for installing optical devices in accordance with another embodiment of the invention.
Figure 4B:
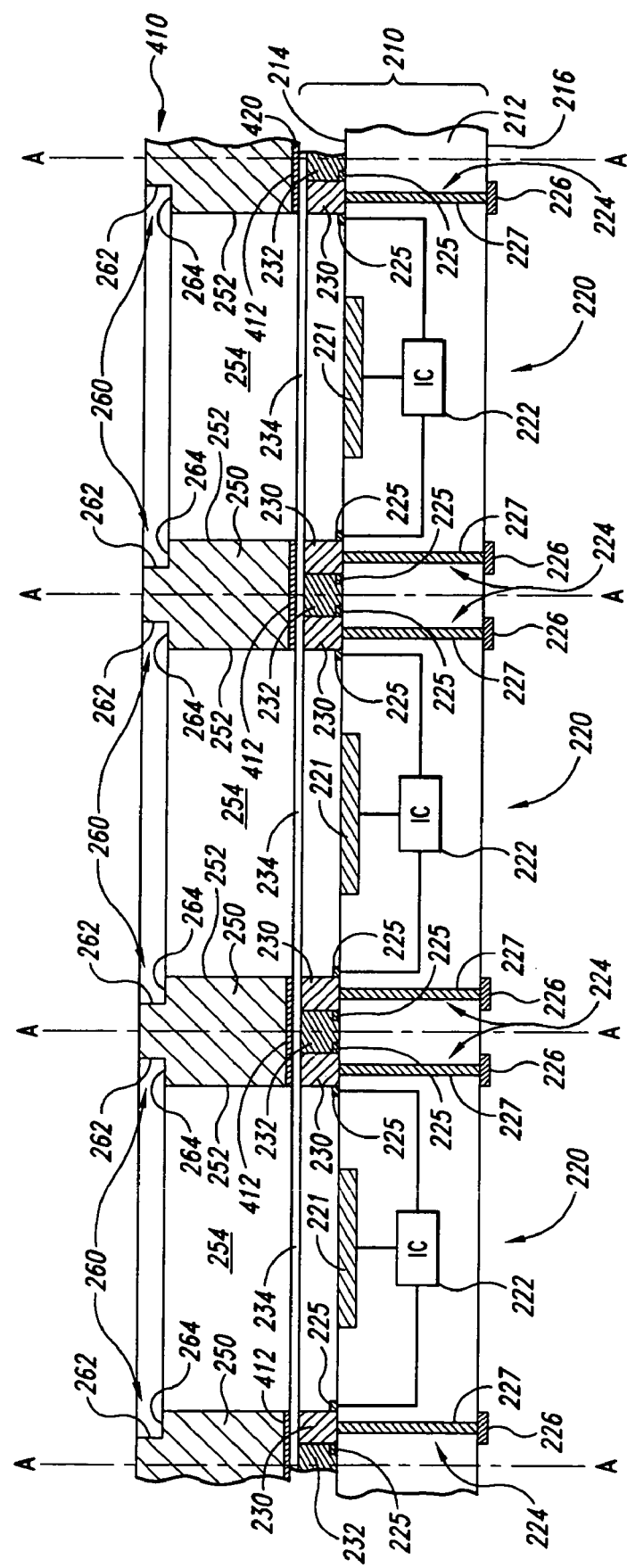

FIGS. 4A and 4B illustrate a method for fabricating the optics supports 250 in accordance with another embodiment of the invention. Referring to FIG. 4A, the optics supports 250 can be formed separately from the imager workpiece 210 and then attached to the imager workpiece 210 at the wafer level. The optics supports 250, for example, can be made from a support material layer 410 composed of a polymeric material, glass, or other suitable material. The bearing elements 260 and the openings 254 can be formed by injection molding the support material. For example, a polymeric material or glass can be molded to form the optics supports 250 having the openings 254 and the bearing elements 260. In another embodiment, the support material layer 410 can initially be a solid plate or wafer in which the openings 254 and the bearing elements 260 are formed by etching, machining and/or ablating the support material layer 410. The support elements 250 in this embodiment include footings 412 on the backside of the support material layer 410.

FIG. 4B illustrates another stage in this embodiment in which the footings 412 of the support members 250 are attached to the cover 234. The footings 412 can be secured to the cover 234 using an adhesive 420. The optics supports 250 are accordingly constructed on the imager workpiece 210 by attaching a plurality of the optics supports 250 to the cover 234 before singulating the imager workpiece 210. The optical devices 270 (FIG. 2) can then be attached to the optics supports 250 as explained above.

Figure 5:
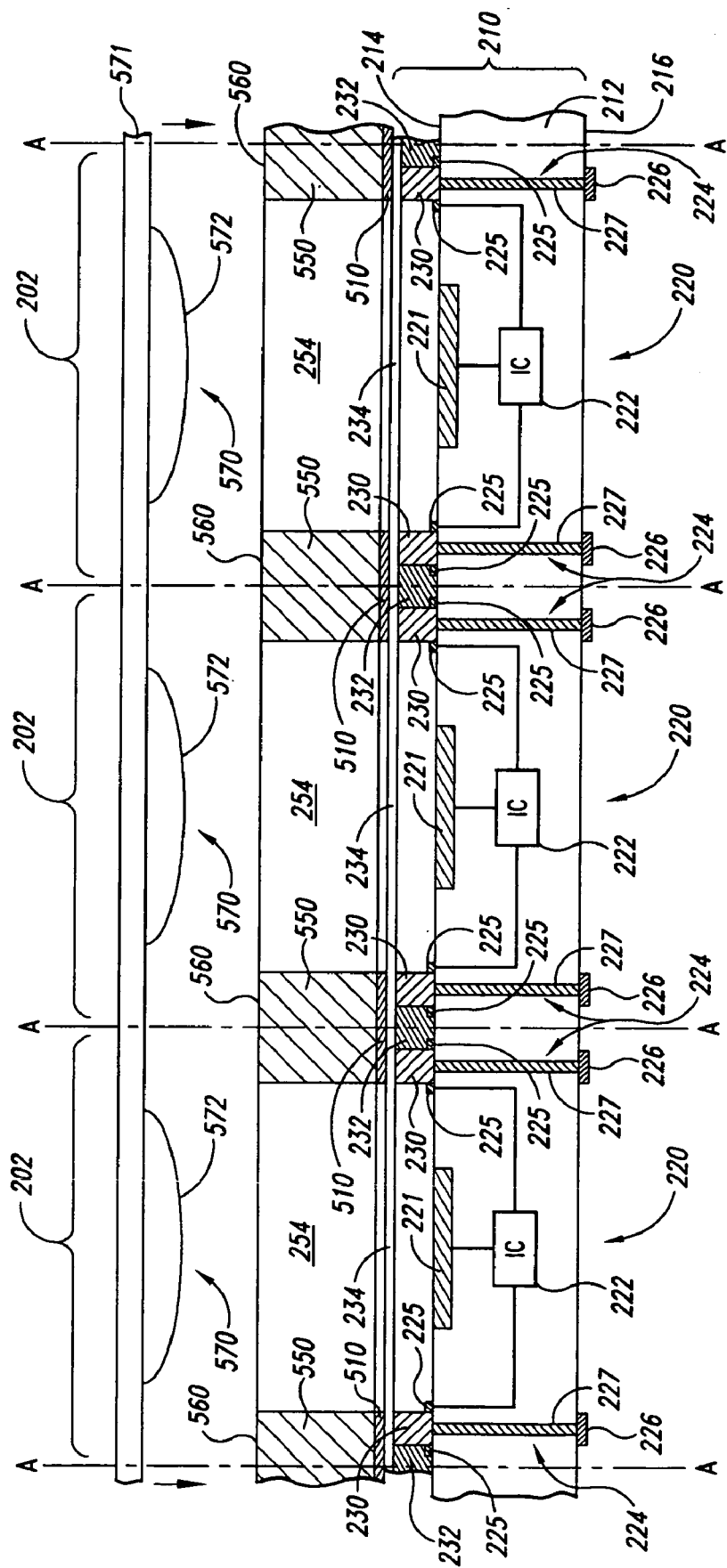
FIG. 5 is a schematic cross-sectional illustrating a method of installing optical devices in accordance with yet another embodiment of the invention.

FIG. 5 illustrates a method for forming a plurality of optics supports 550 in accordance with another embodiment of the invention. In this embodiment, the optics supports 550 are formed by depositing a seed layer 510 of conductive material onto the cover 234 and patterning the seed layer 510 to form electrically conductive regions on top of the cover 234. The electrically conductive regions of the seed layer 510 are typically superimposed over a peripheral zone around the image sensors 221. An electrical potential is then applied to the seed layer 510 while the workpiece 210 is placed in a bath of plating material. The material plates on top of the seed layer 510 to form the optics supports 550 having bearing elements 560 at a desired elevation with respect to the image sensors 221. A plurality of optical devices 570 can then be attached to the optics supports 550. In this embodiment, the optical devices 570 have optics elements 572 attached to a common second substrate 571. The bearing elements 560 in this embodiment space the optics elements 572 apart from corresponding image sensors 221 by a desired focal distance. The optics elements 572 are aligned with corresponding image sensors 221 using the automated handling equipment to position the second substrate 571 in a desired alignment with the imager workpiece 210.

Figure 6:
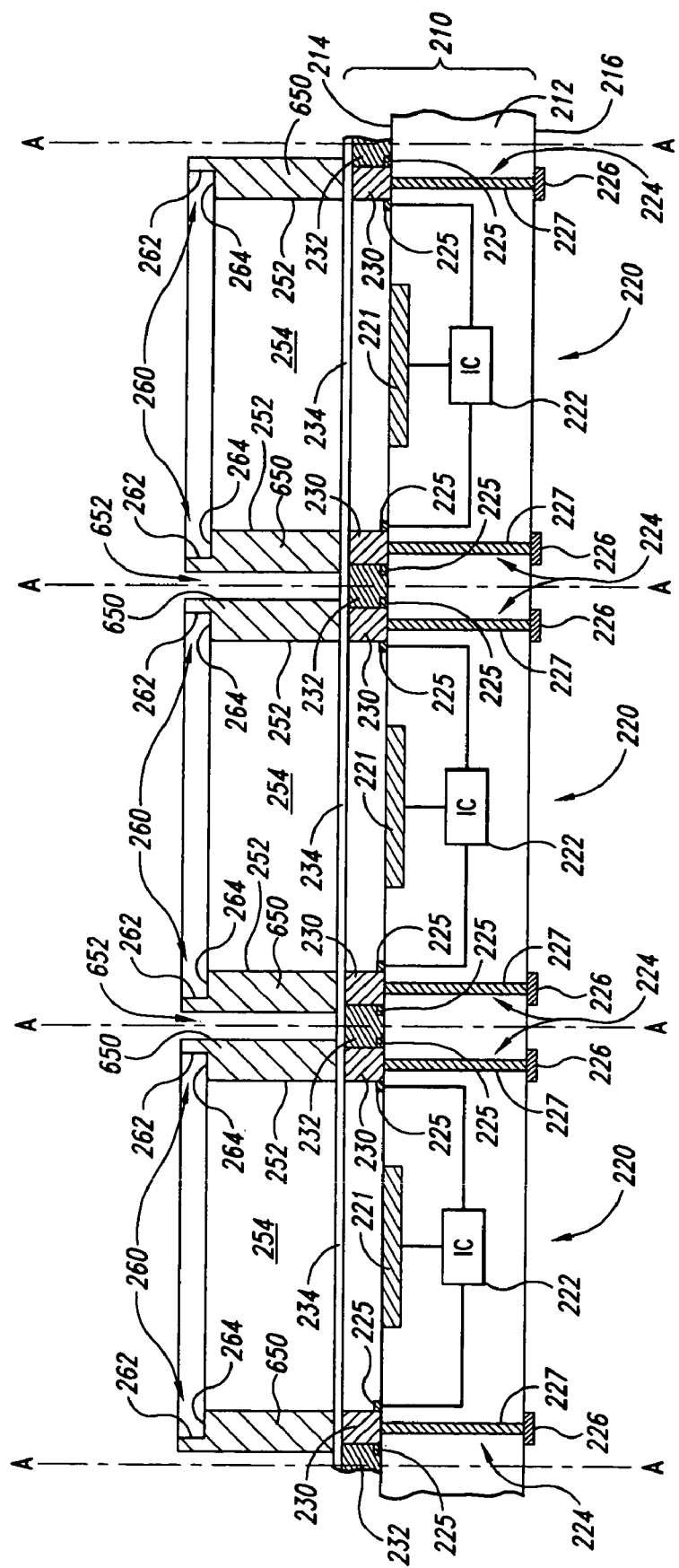
FIG. 6 is a schematic side cross-sectional view of a method for installing optical devices in accordance with still another embodiment of the invention.

FIG. 6 illustrates another method for constructing optics supports on the imager workpiece 210 in accordance with another embodiment of the invention. In this embodiment, the optics supports 650 are constructed on the imager workpiece 210 in accordance with any of the methods described above with respect to FIGS. 3A–5. For example, the optics support 650 can be formed by depositing a support material layer onto the cover 234 and then etching the support material layer to form the openings 254, the bearing elements 260, and gaps 652 between individual optics supports 650. Alternatively, the optics supports 650 can be formed separately from the imager workpiece 210 as described above with reference to FIGS. 4A–B or electroplated onto the workpiece 210 as described above with reference to FIG. 5. The optics supports 650 accordingly differ from those shown in FIGS. 3A–5 in that the optics supports 650 are separated from each other by the gaps 652.

Figure 7A:
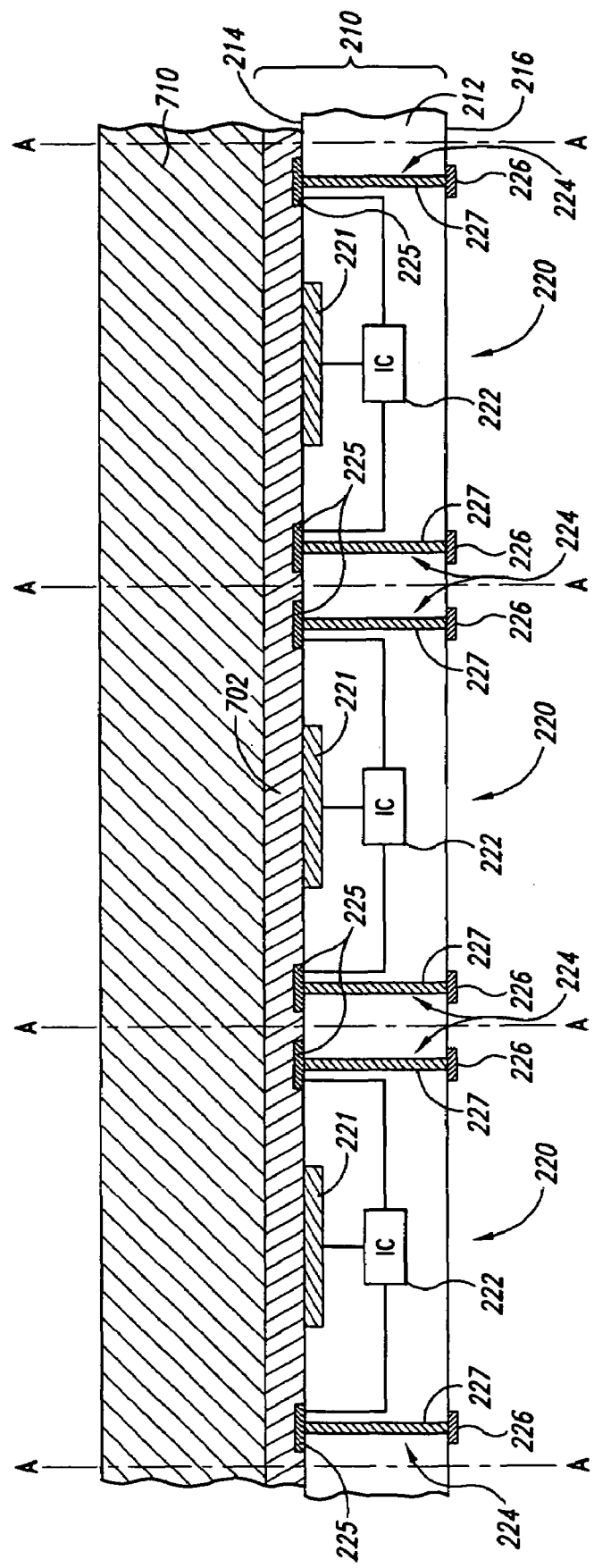
FIG. 7A–7C are schematic side cross-sectional views illustrating stages of a method for installing optical devices in accordance with yet another embodiment of the invention.
Figure 7B:
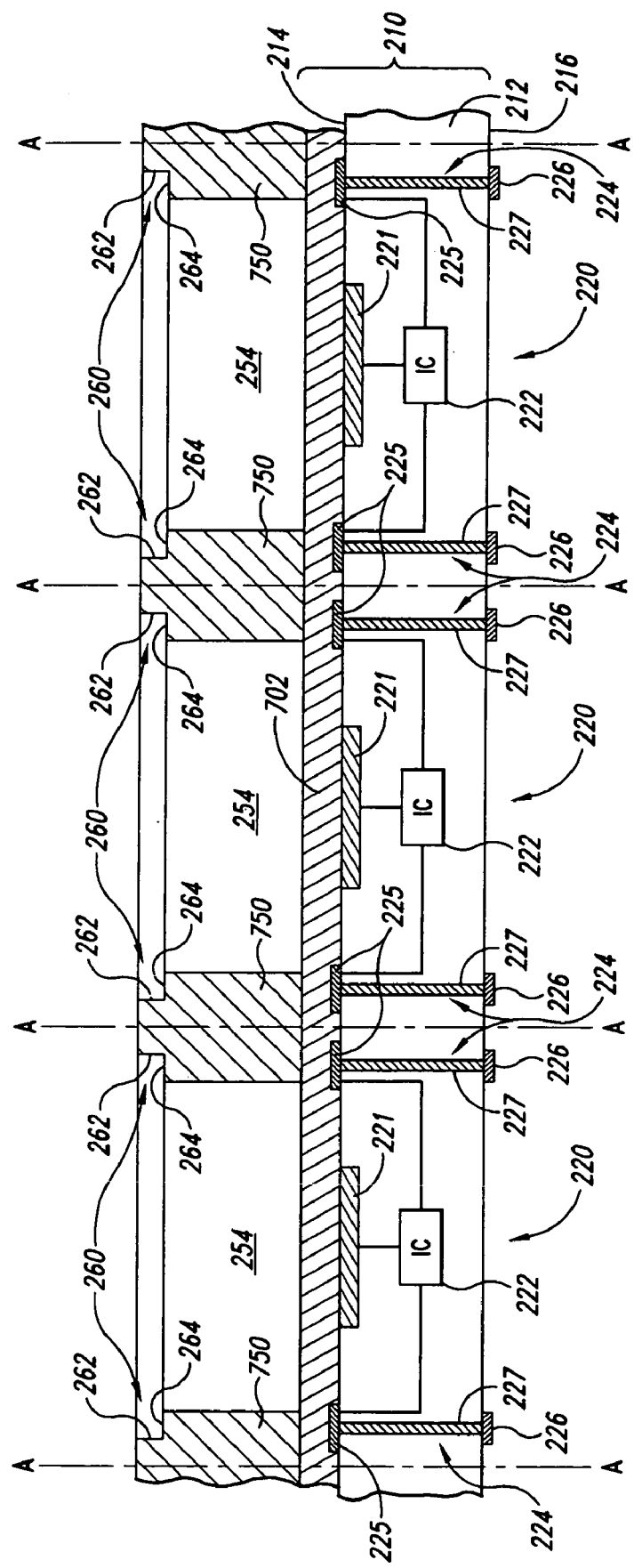
Figure 7C:
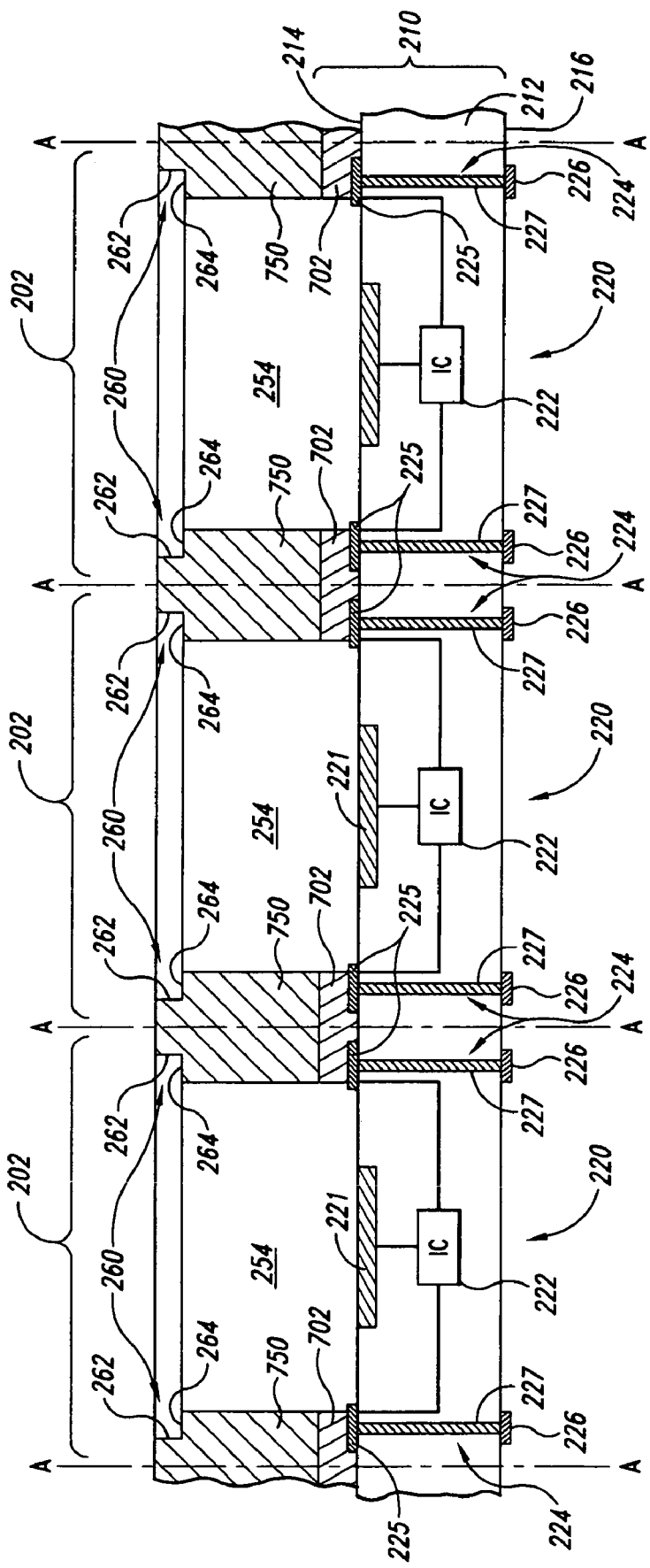

FIGS. 7A–7C illustrate another embodiment of forming optics elements for installing optical devices onto the imager workpiece 210 in accordance with the invention. Referring to FIG. 7A, the imager workpiece 210 in this embodiment does not include the spacers 230 and the cover 234. Instead, a protective layer 702 is deposited over the front side 214 of the first substrate 212. The protective layer 702 can be parylene, an oxide, or another suitable dielectric material. The protective layer 702 can be transparent, semi-transparent or opaque to the selected radiation for operating the image sensors 221 depending upon the particular application. A support material layer 710 is then formed on top of the protective layer 702 in the same manner that the support material layer 310 is formed on top of the cover 234 as described above with reference to FIG. 3A. The support material layer 710 is then etched to form optics supports 750 with bearing elements 260 and openings 254 as shown in FIG. 7B. The second etch for forming the hole 254 can be selective to the support material layer 710 (FIG. 7A) such that it does not etch the protective material 702. In embodiments in which the protective layer 702 is composed of a material that is suitably transmissive to the desired radiation, the optical devices can be mounted to the optics support 750 at this point.

FIG. 7C illustrates a subsequent processing step that is used in embodiments in which the protective layer 702 is not sufficiently transmissive to the desired radiation. In this embodiment, the protective layer 702 is etched to expose the image sensors 221 to the opening 254. The optical devices can then be attached to the optics support 750. In either of the embodiments shown in FIG. 7B or 7C, the optics supports 750 are constructed on the imager workpiece 210 so that they project directly from the first substrate 212. As such, in any of the embodiments shown above with respect to FIGS. 3A–7C, the optics supports 250/550/650/750 are constructed above the first substrate 212 in the sense that they are either directly on the first substrate 212 or on a cover 234 over the first substrate 212.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microelectronic imager assembly, comprising:
a first substrate including a front side and a backside;
a plurality of imaging dies supported by the first substrate, the imaging dies including image sensors at the front side of the first substrate, integrated circuitry operatively coupled to the image sensors, and external contacts electrically coupled to the integrated circuitry;
optics supports coupled to the first substrate and comprising alignment surfaces and openings aligned with corresponding image sensors; and
a plurality of second substrates, each supporting a respective optics element, and respectively coupled to said optics supports by said alignment surfaces,
wherein the alignment surfaces align the second substrates vertically and horizontally with respect to the image sensors.

2. The imager assembly of claim 1, further comprising a plurality of spacers on the first substrate and a cover on the spacers, the spacers having apertures aligned with the image sensors, and the optics supports being on the cover.

3. The imager assembly of claim 1, further comprising a plurality of spacers on the first substrate and a cover on the spacers, wherein the optics supports project away from the cover.

4. The imager assembly of claim 1 wherein:
the imager assembly further comprises a plurality of spacers on the first substrate and a cover on the spacers;
the optics supports comprise sidewalls projecting from the cover; and the optics elements are respectively coupled to the second substrates and aligned with the image sensors.

5. The imager assembly of claim 1 wherein:
the optics supports comprise sidewalls projecting from the first substrate.

6. The imager assembly of claim 1 wherein the optics elements comprise at least one of a focus lens, a dispersion lens, a pin-hole lens, a filter and an anti-reflective film.

7. A microelectronic imager assembly, comprising:
a first substrate including a front side and a backside;
a plurality of imaging dies supported by the first substrate, the imaging dies comprising image sensors at the front side of the first substrate, integrated circuitry operatively coupled to the image sensors, and external contacts electrically coupled to the integrated circuitry;
a plurality of conductive spacers arranged on the first substrate and having apertures aligned with the image sensors;
a cover arranged on the spacers and transmissive to a desired radiation for the image sensors; and
optics supports arranged on the cover, wherein individual optics supports have (a) an opening aligned with a respective one of the image sensors and (b) a bearing element at a reference distance from the image sensor.

8. The imager assembly of claim 7, wherein the optics supports project away from the cover.

9. The imager assembly of claim 7 wherein:
the optics supports comprise sidewalls projecting from the cover;
and the imager assembly further comprises a second substrate attached to the sidewalls and a plurality of optics elements supported by the second substrate and aligned with corresponding image sensors.

10. The imager assembly of claim 7 wherein:
the optics supports comprise sidewalls projecting from the first substrate;
and the imager assembly further comprises a second substrate attached to the sidewalls and a plurality of optics elements supported by the second substrate and aligned with corresponding image sensors.

11. The imager assembly of claim 7 wherein:
the optics supports comprise sidewalls projecting from the first substrate;
and the imager assembly further comprises a plurality of second substrates attached to a sidewall of a corresponding optics support and a plurality of optics elements supported by the second substrate and aligned with corresponding image sensors.

12. A microelectronic imager assembly, comprising:
a workpiece having a front side and a back side;
a plurality of imaging dies supported by the workpiece, the imaging dies comprising image sensors at the front side and external contacts arranged in discrete arrays at the backside, and the external contacts in an individual array being operatively coupled to an individual image sensor;
a plurality of conductive spacers on the workpiece, the spacers having apertures aligned with image sensors;
a cover on the spacers, the cover being transmissive to a desired radiation for the image sensors; and
a plurality of optics supports projecting from the cover, wherein individual optics supports have (a) an opening aligned with a respective one of the image sensors and (b) a bearing element at a reference distance relative to the image sensor.

13. The imager assembly of claim 12 wherein:
the optics supports comprise sidewalls projecting from the cover; and
the imager assembly further comprises a second substrate attached to the sidewalls and a plurality of optics elements supported by the second substrate and aligned with corresponding image sensors.

14. The imager assembly of claim 12 wherein:
the imager assembly further comprises a second substrate attached to the sidewalls and a plurality of optics elements supported by the second substrate and aligned with corresponding image sensors.

15. The imager assembly of claim 12 wherein:
the imager assembly further comprises a plurality of second substrates attached to a sidewall of a corresponding optics support and a plurality of optics elements supported by the second substrates and aligned with corresponding image sensors.

* * * * *